United States Patent
Ro et al.

(10) Patent No.: US 8,837,234 B2
(45) Date of Patent: Sep. 16, 2014

(54) VOLTAGE CONTROL METHOD TO MINIMIZE A COUPLING NOISE BETWEEN ADJACENT GLOBAL BIT LINES DURING READ-WHILE OPERATION AND MEMORY DEVICE USING THE SAME

(75) Inventors: Yu Hwan Ro, Seongnam-si (KR); Beak Hyung Cho, Hwaseong-si (KR); Ki Whan Song, Yongin-si (KR); Young Don Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 427 days.

(21) Appl. No.: 13/209,010

(22) Filed: Aug. 12, 2011

(65) Prior Publication Data

US 2012/0039141 A1     Feb. 16, 2012

(30) Foreign Application Priority Data

Aug. 13, 2010  (KR) ........................ 10-2010-0078098

(51) Int. Cl.
| | | |
|---|---|---|
| *G11C 7/00* | (2006.01) | |
| *G11C 11/4094* | (2006.01) | |
| *G11C 7/02* | (2006.01) | |
| *G11C 7/10* | (2006.01) | |
| *G11C 7/12* | (2006.01) | |
| *G11C 7/18* | (2006.01) | |
| *G11C 11/4097* | (2006.01) | |

(52) U.S. Cl.
CPC .............. *G11C 11/4094* (2013.01); *G11C 7/02* (2013.01); *G11C 7/1048* (2013.01); *G11C 7/12* (2013.01); *G11C 7/18* (2013.01); *G11C 11/4097* (2013.01)

USPC ................. 365/189.11; 365/203; 365/189.09; 365/158

(58) Field of Classification Search
CPC ........ G11C 7/12; G11C 7/18; G11C 11/4094; G11C 11/4097
USPC ........... 365/203, 189.11, 189.09, 158, 230.06
See application file for complete search history.

(56) References Cited

U.S. PATENT DOCUMENTS

| | | | |
|---|---|---|---|
| 4,964,081 A | 10/1990 | Birrittella et al. | |
| 5,877,984 A | 3/1999 | Engh | |
| 6,088,264 A | 7/2000 | Hazen et al. | |
| 6,738,300 B2 * | 5/2004 | Barth, Jr. ..................... | 365/203 |
| 7,940,590 B2 * | 5/2011 | Martinelli et al. ............ | 365/204 |
| 8,120,959 B2 * | 2/2012 | Lee et al. ................ | 365/185.13 |
| 2005/0141282 A1 * | 6/2005 | Abedifard et al. ....... | 365/185.25 |

FOREIGN PATENT DOCUMENTS

| | | |
|---|---|---|
| KR | 10-2009-0020325 A | 2/2009 |
| KR | 10-2009-0090601 A | 8/2009 |

\* cited by examiner

*Primary Examiner* — Kretelia Graham
(74) *Attorney, Agent, or Firm* — Sughrue Mion, PLLC

(57) ABSTRACT

A memory device is provided, which includes a plurality of global bit lines, a discharge line, a switching circuit configured to connect the plurality of global bit lines to the discharge line in response to a discharge enable signal, a first discharge circuit configured to apply a first voltage that is higher than a ground voltage to the discharge line, a precharge circuit configured to apply a precharge voltage to a selected global bit line among the plurality of global bit lines, and a second discharge circuit configured to discharge the selected global bit line to a second voltage that is higher than the ground voltage.

20 Claims, 18 Drawing Sheets

VOLTAGE CONTROL METHOD TO MINIMIZE A COUPLING NOISE BETWEEN ADJACENT GLOBAL BIT LINES DURING READ-WHILE OPERATION AND MEMORY DEVICE USING THE SAME

CROSS-REFERENCE TO RELATED APPLICATION

This application claims priority from Korean Patent Application No. 10-2010-0078098 filed on Aug. 13, 2010, the disclosure of which is hereby incorporated by reference in its entirety.

BACKGROUND

Systems and apparatuses consistent with present disclosure relate to a memory device, and more particularly, to a memory device robust to coupling noise in a read-while-write operation, and memory system using the same.

Non-volatile memory devices using a resistance material include phase-change random access memory (PRAM), resistive RAM (RRAM), and magnetic RAM (MRAM). In order to accommodate the increasing capacity and integration of non-volatile memory devices, a read global bit line for reading data from a first non-volatile memory cell, and a write global bit line for writing data to a second non-volatile memory cell are together implemented in a memory cell array of non-volatile memory devices. For instance, a read-while-write operation, in which a read operation on one memory area is performed while a write operation on another memory is performed, may be achieved.

However, since a write voltage is applied to one global bit line and a read voltage is applied to another global bit line during the read-while-read operation, coupling noise may occur between adjacent global bit lines, which may deteriorate the data reliability of semiconductor memory devices.

SUMMARY

One or more exemplary embodiments provide a method of minimizing coupling noise between a write global bit line and a read global bit line adjacent thereto and a device and system for performing the method.

According to an aspect of an exemplary embodiment, there is provided a method of controlling a voltage of a memory device. The method includes connecting a plurality of global bit lines with a discharge line in response to a discharge enable signal, and applying a first voltage that is higher than a ground voltage to the discharge line.

The operation of applying the first voltage to the discharge line may include applying a threshold voltage of at least one diode-connected transistor as the first voltage.

The method may further include the operation of applying a precharge voltage to one global bit line selected from among the plurality of global bit lines.

The method may further include the operation of discharging the selected global bit line to a second voltage that is higher than the ground voltage.

The operation of discharging the selected global bit line may include controlling a discharge slope of the second voltage in response to a slope control signal.

According to an aspect of another exemplary embodiment, there is provided a memory device including a plurality of global bit lines, a discharge line, a switching circuit configured to connect the plurality of global bit lines to the discharge line in response to a discharge enable signal, and a first discharge circuit configured to apply a first voltage higher than a ground voltage to the discharge line.

The first discharge circuit may include at least one diode-connected transistor connected between the discharge line and a ground.

As an alternative, the first discharge circuit may include a plurality of diode-connected transistors connected in series between the discharge line and ground; and a plurality of switches connected in parallel with the plurality of diode-connected transistors, respectively.

Alternatively, the first discharge circuit may include a plurality of diode-connected transistors connected in series between the discharge line and ground and at least one switch connected between the ground and a common node of two transistors among the plurality of diode-connected transistors.

The memory device may further include a precharge circuit configured to apply a precharge voltage to a selected global bit line among the plurality of global bit lines and a second discharge circuit configured to discharge the selected global bit line to a second voltage higher than the ground voltage.

The first voltage may be the same as the second voltage.

The second discharge circuit may include a plurality of diode-connected transistors connected in series between the selected global bit line and ground; and a plurality of switches connected in parallel with the plurality of diode-connected transistors, respectively.

Alternatively, the second discharge circuit may include a slope control circuit configured to control a discharge slope of the second voltage in response to a slope control signal and at least one diode-connected transistor connected between the slope control circuit and a ground.

The second discharge circuit may further include a bias circuit connected between the ground and at least one transistor among the plurality of diode-connected transistors.

According to another exemplary embodiment, there is provided a memory system including the above-described memory device and a processor configured to control an operation of the memory device.

The first discharge circuit may include at least one diode-connected transistor connected between the discharge line and ground.

The memory device may further include a precharge circuit configured to apply a precharge voltage to a selected global bit line among the plurality of global bit lines and a second discharge circuit configured to discharge the selected global bit line to a second voltage that is higher than the ground voltage.

The memory system may be a personal computer, a tablet personal computer, a solid state drive, or a cellular phone.

According to another exemplary embodiment, there is provided a three-dimensional memory device including a first local bit line in a first layer, a second local bit line in a second layer, a global bit line, a first switching circuit configured to connect either the first local bit line or the second local bit line to the global bit line, a discharge line, a second switching circuit configured to connect the global bit line to the discharge line in response to a discharge enable signal, and a first discharge circuit configured to apply a first voltage that is higher than a ground voltage to the discharge line.

The three-dimensional memory device may further include a precharge circuit configured to apply a precharge voltage to the global bit line and a second discharge circuit configured to discharge the global bit line to a second voltage that is higher than the ground voltage.

BRIEF DESCRIPTION OF THE DRAWINGS

The above and other features will become more apparent by describing in detail exemplary embodiments with reference to the attached drawings in which.

DETAILED DESCRIPTION OF THE EXEMPLARY EMBODIMENTS

Figure 1:
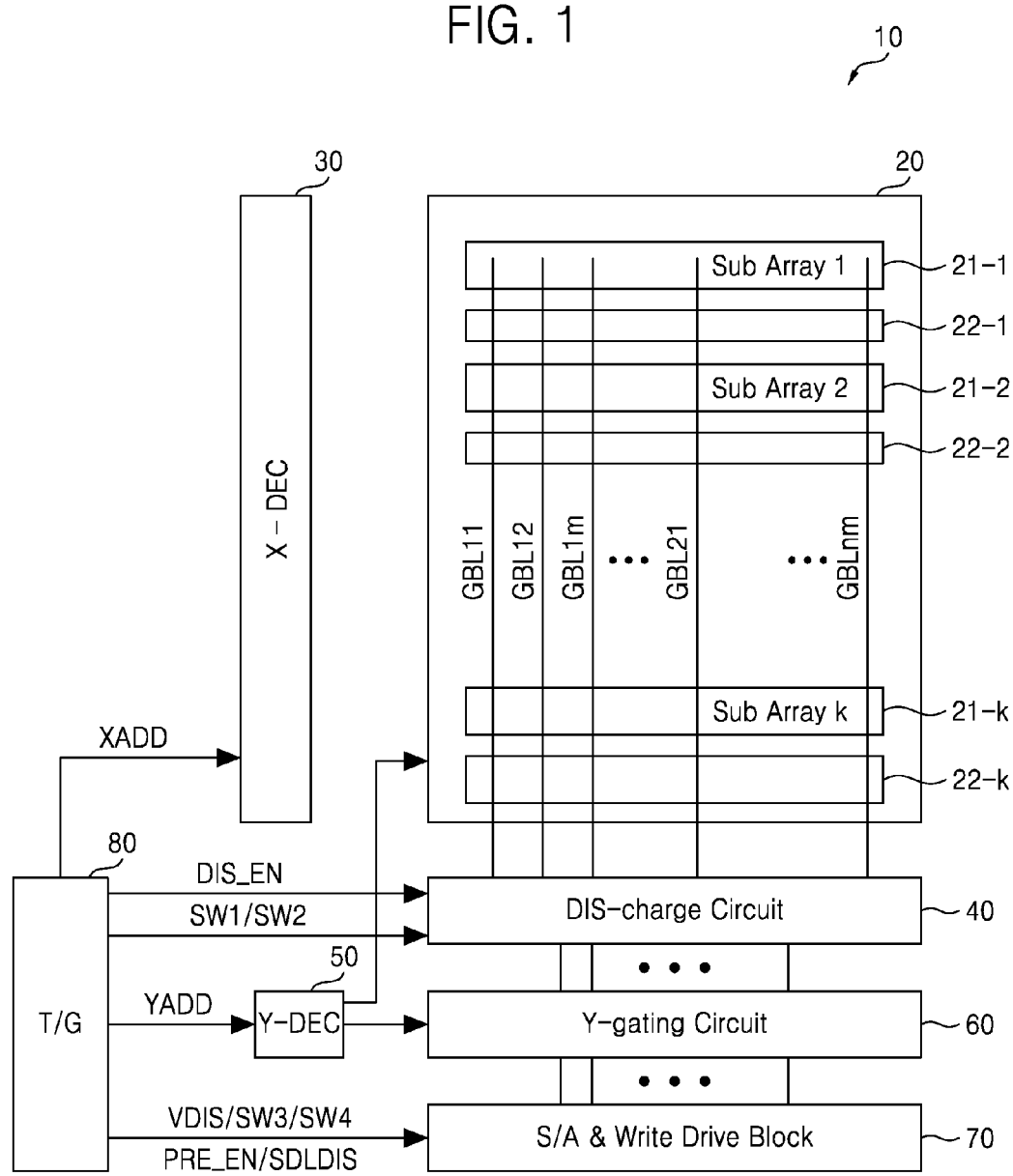
FIG. 1 is a block diagram of a memory device according to an exemplary embodiment.

Exemplary embodiments now will be described more fully hereinafter with reference to the accompanying drawings. The exemplary embodiments may, however, be embodied in many different forms and should not be construed as limited to the embodiments set forth herein. Rather, these embodiments are provided so that this disclosure will be thorough and complete. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the exemplary embodiments belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Figure 2:
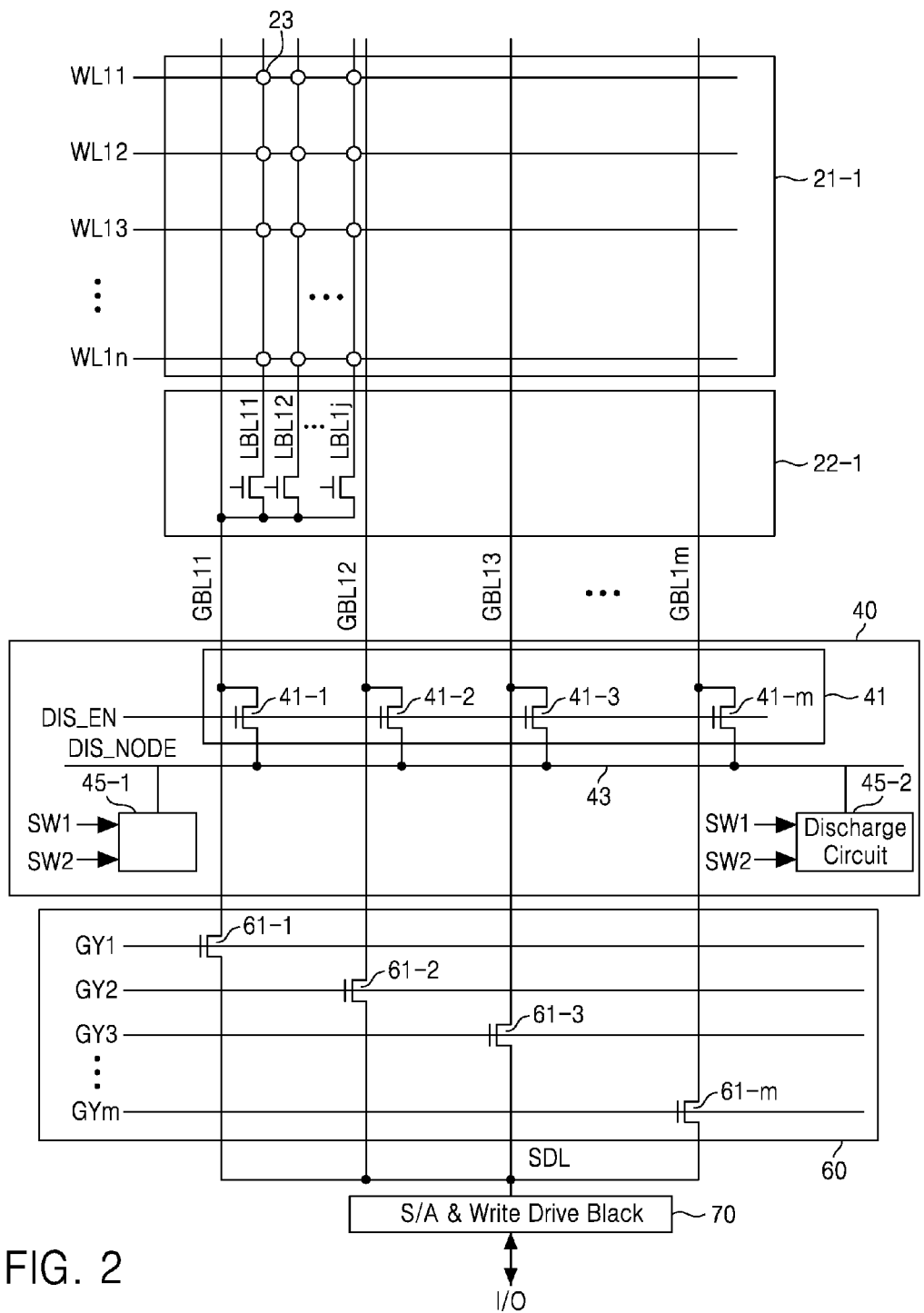
FIG. 2 is a circuit diagram of the memory device illustrated in FIG. 1.

FIG. 1 is a block diagram of a memory device 10 according to an exemplary embodiment. FIG. 2 is a circuit diagram of the memory device 10 illustrated in FIG. 1. The memory device 10 illustrated in FIGS. 1 and 2 is a semiconductor device that can perform a voltage control method according to an exemplary embodiment and may be a volatile or non-volatile memory device.

The volatile memory device may be, for example, a dynamic random access memory (DRAM), a static RAM (SRAM), a thyristor RAM (T-RAM), a zero capacitor RAM (Z-RAM), or a twin transistor RAM (TTRAM). The non-volatile memory device may be, for example, an electrically erasable programmable read-only memory (EEPROM), a flash memory, a ferroelectric RAM (FeRAM or FRAM), a magnetoresistive RAM (MRAM), a phase-change RAM (PRAM), a resistive RAM (RRAM), or a nano-RAM (NRAM).

For clarity of the description, the memory device 10 is assumed to be a PRAM, however, the PRAM is merely an example, and the exemplary embodiment can be used for both volatile and non-volatile memory devices.

Figure 6:
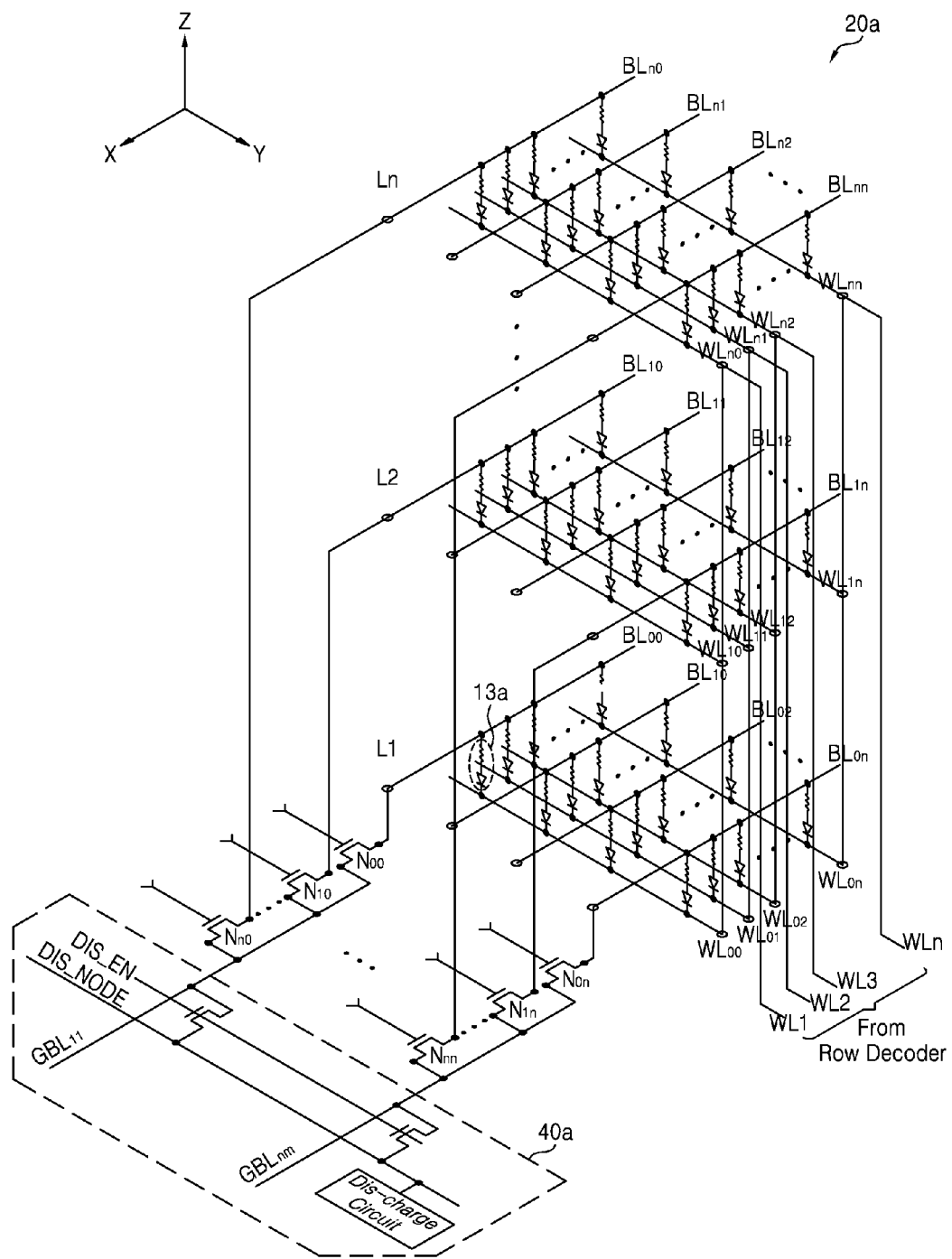
FIG. 6 is a diagram of a memory cell array implemented in three dimensions in the memory device illustrated in FIG. 1.

Referring to FIGS. 1 and 2, the non-volatile memory device 10 includes a memory cell array 20 or 20a illustrated in FIG. 1 or FIG. 6 which can be implemented in two or three dimensions, a row decoder 30, a discharge circuit block 40, a column decoder 50, a Y-gating circuit 60, a sense amplifier (S/A) and write drive block 70, and a timing generator 80.

The memory cell array 20 implemented in two dimensions includes a plurality of global bit lines GBL11 through GBLnm, a plurality of sub arrays 21-1 through 21-$k$, and a plurality of local bit line selection circuits 22-1 through 22-$k$.

Since the sub arrays 21-1 through 21-$k$ have substantially the same structure, the structure and the operation of the first sub array 21-1 only will be described. As shown in FIG. 2, the first sub array 21-1 includes a plurality of non-volatile memory cells 23. Each of the non-volatile memory cells 23 is connected with one of a plurality of word lines WL11 through WL1n and one of a plurality of bit lines LBL11 through LBL1j, respectively.

Since the local bit line selection circuits 22-1 through 22-k have the same structure, the structure and the operation of the first local bit line selection circuit 22-1 only will be described. The first local bit line selection circuit 22-1 includes a plurality of switching circuits. The switching circuits connect the respective bit lines LBL11 through LBL1j to the first global bit line GBL11 in response to a plurality of local bit line selection signals, respectively, from the column decoder 50.

Each of the non-volatile memory cells 23 store data using a phase-change material, e.g., GeSbTe (GST), and include a memory element and a select element. The phase-change material is switched between two stable states, i.e., a crystalline state and an amorphous state according to temperature.

Figure 3:
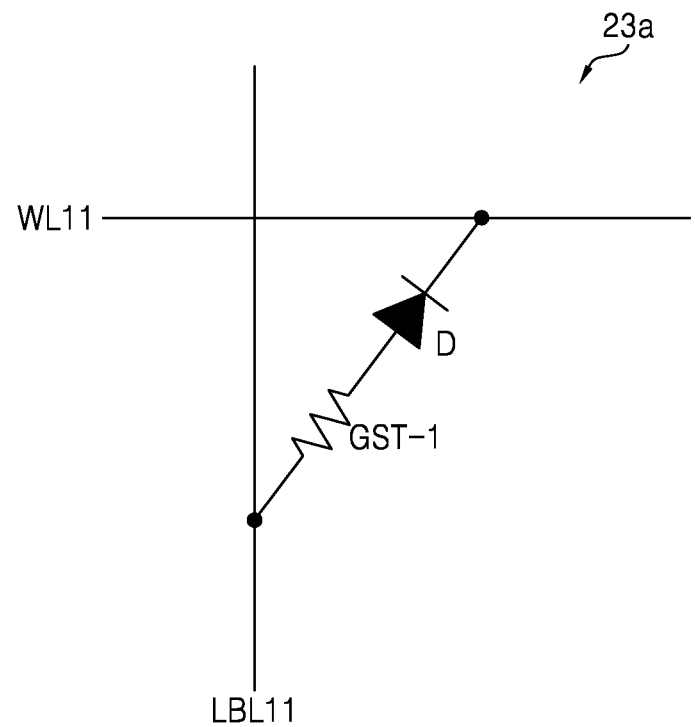
FIG. 3 is a diagram of a memory cell illustrated in FIG. 2, according to an exemplary embodiment.

FIG. 3 is a diagram of one memory cell 23a among the non-volatile memory cells 23 illustrated in FIG. 2, according to an exemplary embodiment. The memory cell 23a illustrated in FIG. 3 is a non-volatile memory cell and includes a memory element GST-1 and a select element D which are connected in series between the bit line LBL11 and the word line WL11.

The memory element GST-1 is implemented by a phase change material like GST and the select element D is implemented by a diode D. In other words, the anode of the diode D is connected to the memory element GST-1 and the cathode of the diode D is connected to the word line WL11. When a voltage difference between the anode and the cathode of the diode D is greater than a threshold voltage of the diode D, the memory element GST-1 of the non-volatile memory cell 23a may be provided with a program current, e.g., a set current or a reset current, through the bit line LBL11.

Figure 4:
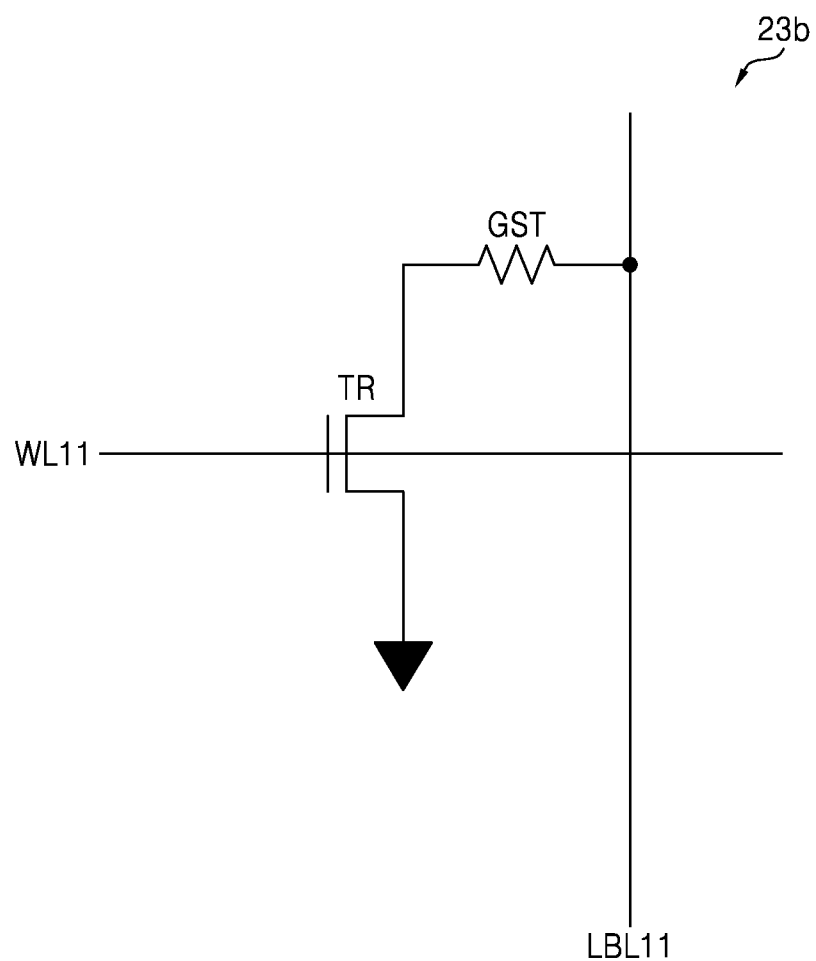
FIG. 4 is a diagram of the memory cell illustrated in FIG. 2, according to an exemplary embodiment.

FIG. 4 is a diagram of one memory cell 23b among the non-volatile memory cells 23 illustrated in FIG. 2, according to an exemplary embodiment. The memory cell 23b illustrated in FIG. 4 is a non-volatile memory cell and includes a memory element GST and a select element TR which are connected in series between the bit line LBL11 and a power line (e.g., a ground line for supplying a ground voltage or a power line for supplying a predetermined voltage).

The memory element GST may be implemented by a phase change material like GST and the select element TR may be implemented by a transistor TR. When a voltage supplied to the word line WL11 is greater than a threshold voltage of the transistor TR, the memory element GST of the non-volatile memory cell 23b may be provided with a program current, e.g., a set current or a reset current, through the bit line LBL11.

Figure 5:
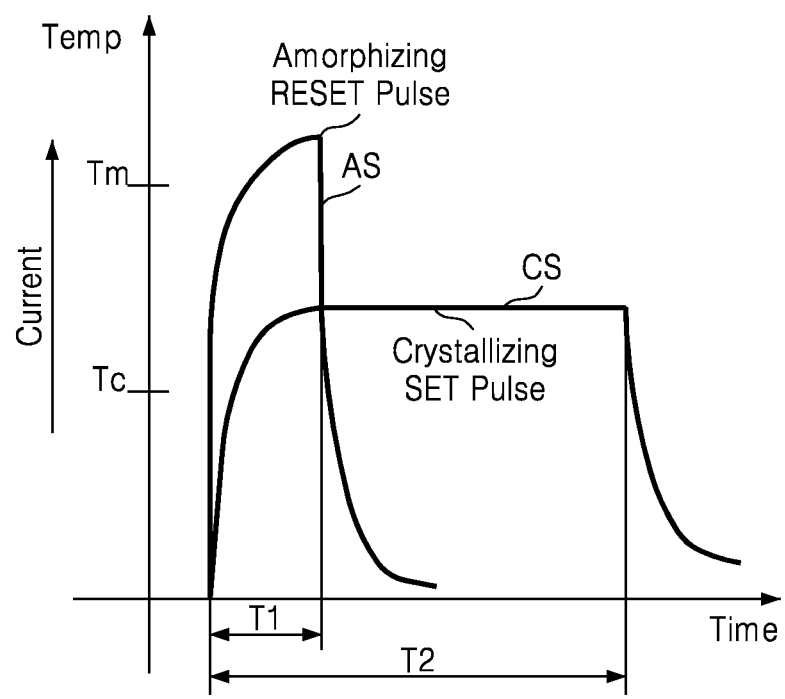
FIG. 5 is a graph showing the characteristics of a phase-change material illustrated in FIGS. 3 and 4.

FIG. 5 is a graph showing the characteristics of the phase-change material, i.e., GST illustrated in FIGS. 3 and 4. The curve AS indicates a condition, e.g., a current, allowing the phase-change material, GST, to transform into the amorphous state and the curve CS indicates a condition, e.g., a current, allowing the phase-change material, GST, to transform into the crystalline state.

Referring to FIGS. 3 through 5, the phase-change material, GST, transforms into the amorphous state when it is heated by the current AS supplied through the bit line LBL11 during a first time T1 to a temperature higher than a melting temperature Tm and then rapidly quenched. The phase-change material, GST, transforms into the crystalline state when it is heated by the current CS supplied through the bit line LBL11 during a second time T2 longer than the first time T1 (i.e., T2>T1) to a temperature higher than a crystallization temperature Tc and lower than the melting temperature Tm and then gradually quenched.

The non-volatile memory cells 23, 23a, and 23b have a greater resistance when the phase-change material, GST, is in the amorphous state than when the phase-change material, GST, is in the crystalline state. Accordingly, the phase-change material, GST, can store data using the difference in resistance. The amorphous state may be called a reset state and may indicate storing data "1". The crystalline state may be called a set state and may indicate storing data "0".

Referring back to FIGS. 1 and 2, the row decoder 30 decodes a row address XADD output from the timing generator 80 performing the function of a control logic and selectively drives one of a plurality of word lines included in the memory cell array 20 according to a result of the decoding.

The discharge circuit block 40 includes a discharge line 43, a switching circuit 41, and one or more first discharge circuits 45-1 and 45-2. The switching circuit 41 includes a plurality of switches 41-1 through 41-m which connect the global bit lines GBL11 through GBL1m, respectively, to the discharge line 43 in response to a first discharge enable signal DIS_EN. Each of the switches 41-1 through 41-m may be implemented by a metal-oxide semiconductor (MOS) transistor.

At least one of the first discharge circuits 45-1 and 45-2 discharge the discharge line 43 to a first voltage that is higher than the ground voltage in response to one or more switching signals SW1 and SW2. In other words, during a discharge operation, the discharge line 43 is discharged to the first voltage instead of the ground voltage. Accordingly, each of the global bit lines GBL11 through GBL1m connected to the discharge line 43 is discharged to the first voltage.

For clarity of the description, the two first discharge circuits 45-1 and 45-2 are illustrated in FIG. 2, but this is just an example. The number of first discharge circuits connected to the discharge line 43 may be different depending on design rules.

The column decoder 50 decodes a column address YADD output from the timing generator 80 and outputs a plurality of global bit line selection signals GY1 through GYm and a plurality of local bit line selection signals according to a result of the decoding.

The Y-gating circuit 60 controls the connection of the memory cell array 20 and the S/A and write drive block 70 in response to the global bit line selection signals GY1 through GYm output from the column decoder 50. For instance, a plurality of switches 61-1 through 61-m included in the Y-gating circuit 60 control the connection between the respective global bit lines GBL11 through GBL1m and the S/A and write drive block 70 in response to the global bit line selection signals GY1 through GYm output from the column decoder 50, respectively.

The S/A and write drive block 70 transmits write data to the Y-gating circuit 60 in a write operation and senses and amplifies read data output from the Y-gating circuit 60 in a read operation.

Figure 8:
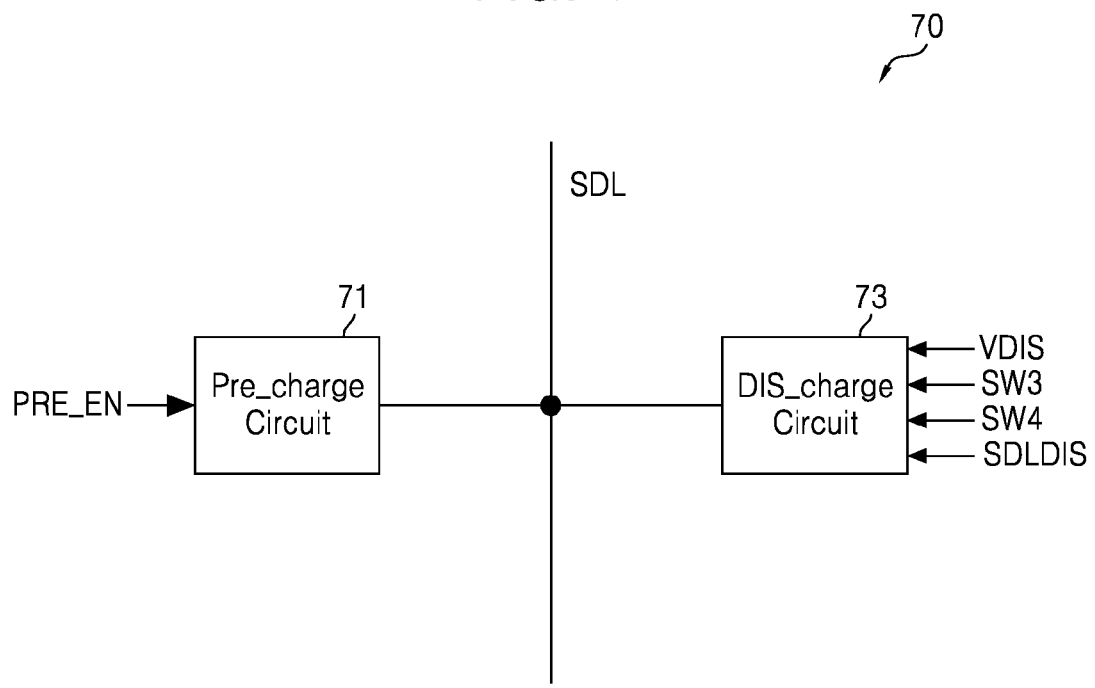
FIG. 8 is a block diagram of a sense amplifier and write drive block illustrated in FIG. 1.

The timing generator 80 may control the overall operation of the memory device 10, e.g., a program or write operation using a voltage control method according to an exemplary embodiment. Accordingly, the timing generator 80 generates the control signals DIS_EN, SW1, and the SW2 for controlling the operation of the discharge circuit block 40 and control signals VDIS, SW3, SW4, PRE_EN, and SDLDIS for controlling the operation of the S/A and write drive block 70. In addition, the timing generator 80 may generate the row address XADD and the column address YADD according to an external command, e.g., a program command or a read command. The number of switching signals generated by the timing generator 80 may be different depending on the number of switches implemented in each of discharge circuits 45-1, 45-2, and 73 (FIG. 8).

FIG. 6 is a diagram of a memory cell array 20a implemented in three dimensions in the memory device 10 illustrated in FIG. 1. Referring to FIGS. 1, 2, and 6, the memory device 10 may include the three-dimensional memory cell array 20a.

The memory cell array 20a includes a plurality of layers L1 through Ln. The layers L1 through Ln may be implemented by a stack of wafers, chips or cells. The layers L1 through Ln may be electrically connected with one another using a through-silicon via (TSV), wire bonding, or a bump.

The first layer L1 includes a plurality of word lines WL00 through WL0n, a plurality of bit lines BL00 through BL0n, and a plurality of non-volatile memory cells 13a. The second layer L2 includes a plurality of word lines WL10 through WL1n, a plurality of bit lines BL10 through BL1n, and a plurality of non-volatile memory cells. The n-th layer Ln includes a plurality of word lines WLn0 through WLnn, a plurality of bit lines BLn0 through BLnn, and a plurality of non-volatile memory cells.

As illustrated in FIG. 6, the word lines WL00 through WL0n to WLn0 through WLnn included in the respective layers L1 through Ln may be connected with one another. For instance, the word lines WL00, WL10, . . . , and WLn0 of the respective layers L1 through Ln may be connected with one another, forming a single word line WL1 and the word lines WL0n, WL1n, . . . , and WLnn of the respective layers L1 through Ln may be connected with one another, forming a single word line WLn. Accordingly, the row decoder 30 can selectively drive the word lines WL1 through WLn.

The first bit lines BL00, BL10, . . . , and BLn0 included in the respective layers L1 through Ln may be connected to the first global bit line GBL11 through first selection switches N00, N10, . . . , and Nn0, respectively. The n-th bit lines BL0n, BL1n, . . . , and BLnn included in the respectively layers L1 through Ln may be connected to the n-th global bit line GBLnm through n-th selection switches N0n, N1n, . . . , and Nnn, respectively.

During the discharge operation, the global bit lines GBL11 through GBLnm may be discharged to the first voltage that is higher than the ground voltage. The scheme of discharging the global bit lines GBL11 through GBLnm to the first voltage is substantially the same as that described above with reference to FIG. 2.

Figure 7:
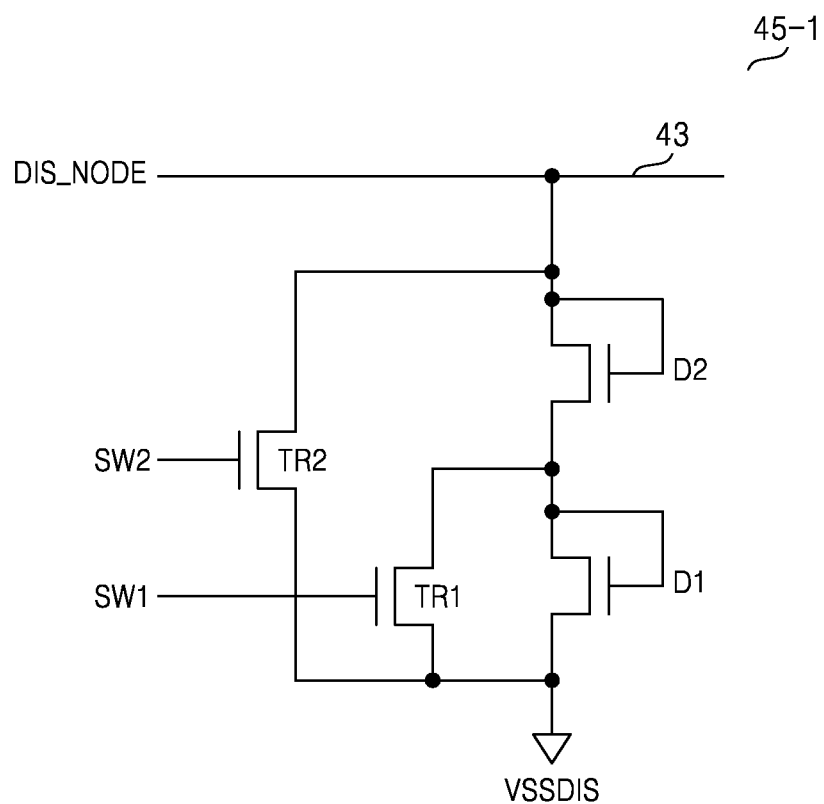
FIG. 7 is a circuit diagram of a first discharge circuit illustrated in FIG. 2.

FIG. 7 is a diagram of the first discharge circuit 45-1 illustrated in FIG. 2. Referring to FIG. 7, the first discharge circuit 45-1 includes one or more diode-connected transistors D1 and D2 and one or more switches TR1 and TR2. For clarity of the description, the two diode-connected transistors D1 and D2 and the two switches TR1 and TR2 are illustrated in FIG. 7.

Each of the diode-connected transistors D1 and D2 may be implemented by an N-type MOS (NMOS) transistor, a P-type MOS (PMOS) transistor, or a PN diode. The diode-connected transistors D1 and D2 are connected in series to each other between the discharge line 43 and a ground VSSDIS.

The first switch TR1 is connected between a common node of the diode-connected transistors D1 and D2 and the ground VSSDIS. The second switch TR2 is connected between the discharge line 43 and the ground VSSDIS.

The first and second switches TR1 and TR2 are turned on or off in response to the first switching signal SW1 and the second switching signal SW2, respectively. Accordingly, the first discharge circuit 45-1 may apply the first voltage, which corresponds to one or two times of a threshold voltage of the diode-connected transistors D1 and D2 and is higher than the ground voltage, to the discharge line 43 depending on whether each of the first and second switches TR1 and TR2 is turned on or off. As a result, each of the global bit lines GBL11 through GBL1m connected to the discharge line 43 may be discharged to the first voltage during the discharge operation.

In another exemplary embodiment, the first discharge circuit 45-1 may include a plurality of diode-connected transistors connected in series between the discharge line 43 and the ground VSSDIS and a plurality of switches respectively connected in parallel with the transistors. In another exemplary embodiment, the first discharge circuit 45-1 may be implemented by a voltage divider which generates a voltage higher than the ground voltage.

FIG. 8 is a block diagram of the S/A and write drive block 70 illustrated in FIG. 1. For clarity of the description, the one precharge circuit 71 and one second discharge circuit 73 are illustrated in FIG. 8.

The precharge circuit 71 precharges a data line SDL to a precharge voltage in response to a precharge enable signal PRE_EN. The second discharge circuit 73 discharges the data line SDL to a second voltage in response to a second discharge enable signal SDLDIS.

Figure 9:
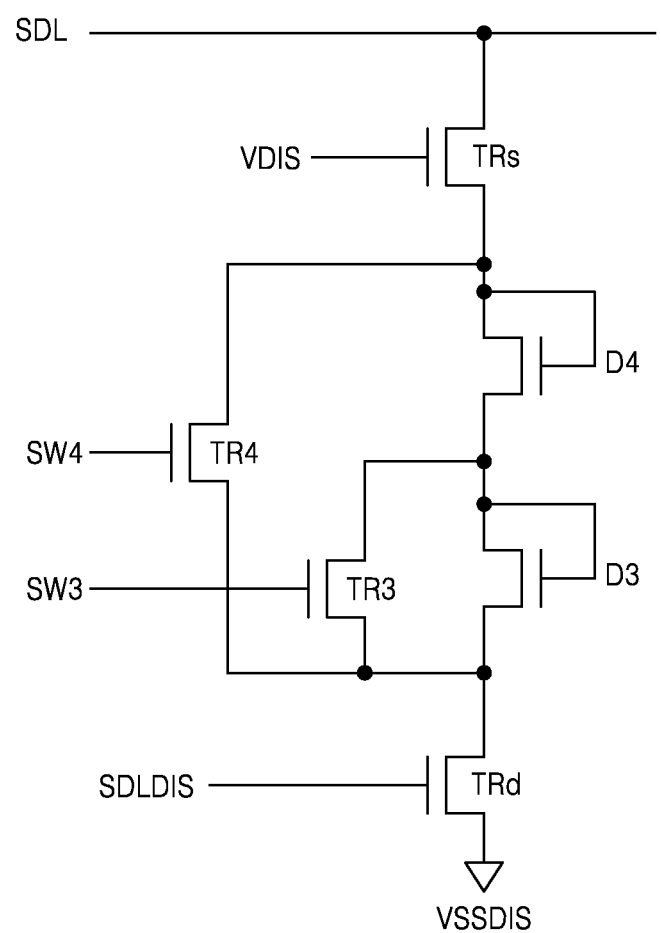
FIG. 9 is a circuit diagram of a second discharge circuit illustrated in FIG. 8.

FIG. 9 is a diagram of the second discharge circuit 73 illustrated in FIG. 8. Referring to FIGS. 8 and 9, the second discharge circuit 73 includes a slope control circuit TRs, one or more diode-connected transistors D3 and D4, one or more switches TR3 and TR4, and a bias circuit TRd. The slope control circuit TRs, at least one of the diode-connected transistors D3 and D4, and the bias circuit TRd are connected in series between the data line SDL and the ground VSSDIS. For clarity of the description, the two diode-connected transistors D3 and D4 and the two switches TR3 and TR4 are illustrated in FIG. 9.

The third switch TR3 is connected between a common node of the transistors D3 and D4 and the bias circuit TRd. The fourth switch TR4 is connected between a common node of the slope control circuit TRs and the transistor D4 and the bias circuit TRd. The slope control circuit TRs may control the discharge slope of a discharge voltage VSDL of the data line SDL in response to a slope control signal VDIS.

The slope control circuit TRs is implemented by a transistor in the exemplary embodiment illustrated in FIG. 9, but the slope control circuit TRs is not limited thereto. The discharge slope may be controlled by adjusting the level of the control signal VDIS applied to a gate of the slope control circuit TRs or adjusting the resistance of the slope control circuit TRs.

The bias circuit TRd may form a current path between the data line SDL and the ground VSSDIS in response to the second discharge enable signal SDLDIS.

The third switch TR3 and the fourth switch TR4 are turned on or off in response to a third switching signal SW3 and a fourth switching signal SW4, respectively, so that the second discharge circuit 73 controls the threshold voltage of the transistors D3 and D4 according to the on/off of the third and fourth switches TR3 and TR4. Accordingly, the data line SDL is discharged to the second voltage (e.g., Vtn or 2Vtn where Vtn is the threshold voltage of the transistors D3 and D4) that is higher than the ground voltage. The discharge voltage VSDL to which the data line SDL is discharged by the second discharge circuit 73 may be the same as the voltage to which the first discharge circuit 45-1 illustrated in FIGS. 2 and 7 discharges the discharge line 43.

The third and fourth switches TR3 and TR4 may be turned off at different times in response to the third and fourth switching signals SW3 and SW4, respectively, so that the second discharge circuit 73 discharges the data line SDL in two stages.

According to an exemplary embodiment, the voltage level of the data line SDL may be controlled to be higher than the ground voltage, so that a coupling noise between adjacent global bit lines is minimized. In addition, only write global bit lines among a plurality of global bit lines may be connected with the second discharge circuit 73, so that the write global bit lines are discharged to a different level than read global bit lines are discharged. Therefore, when types of adjacent global bit lines are different from each other, for example, when a write global bit line is adjacent to a read global bit line, coupling noise is more effectively removed.

Meanwhile, the third and fourth switches TR3 and TR4 are turned on after the 2-stage discharge, so that the second discharge circuit 73 can discharge the data line SDL to the ground voltage. In other words, after minimizing the coupling noise effect, the second discharge circuit 73 discharges the data line SDL to the ground voltage, thereby reducing standby current consumed in the memory device 10. In order to allow the read operation to be performed using a write global bit line, as well as the second discharge circuit 73, the one or more first discharge circuits 45-1 and 45-2 may also discharge the data line SDL to the ground voltage in response to a corresponding switching signal.

Figure 10:
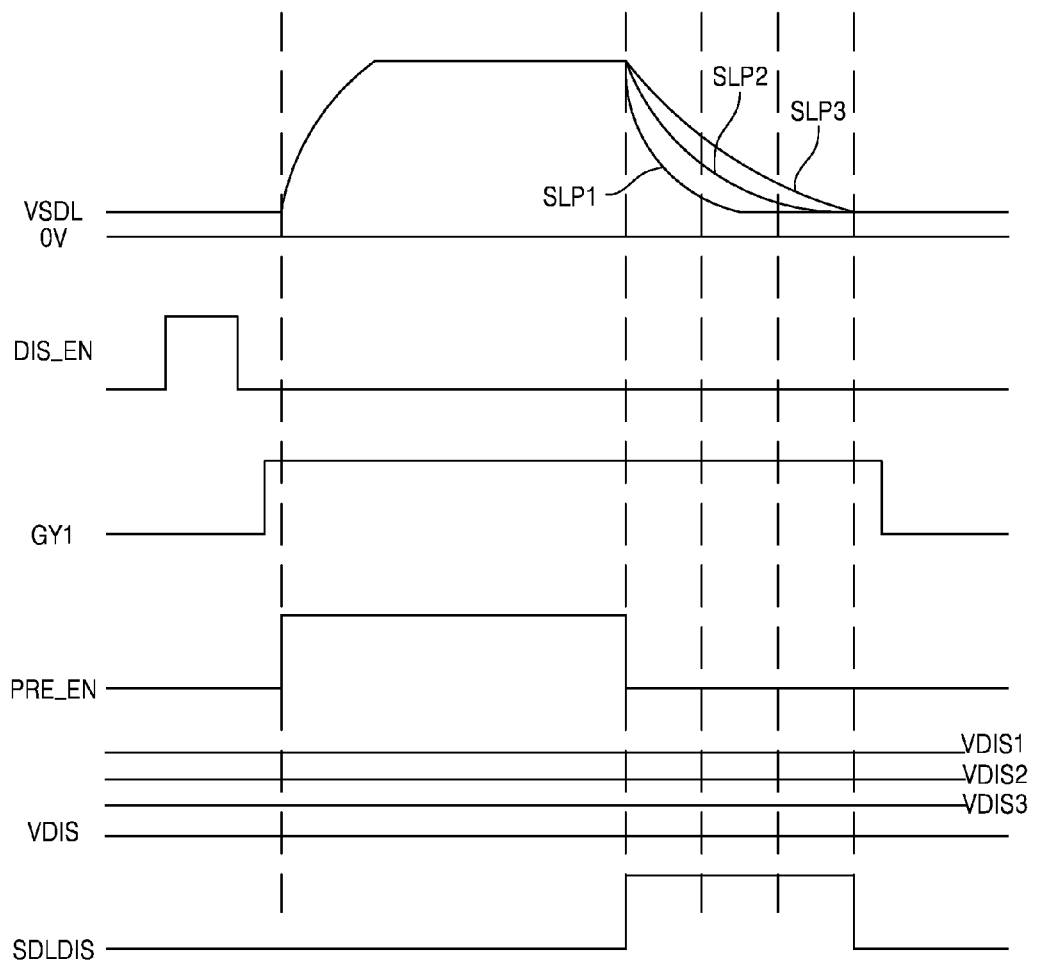
FIG. 10 is a timing chart of control signals for controlling the operation of the memory device illustrated in FIG. 1.
Figure 11:
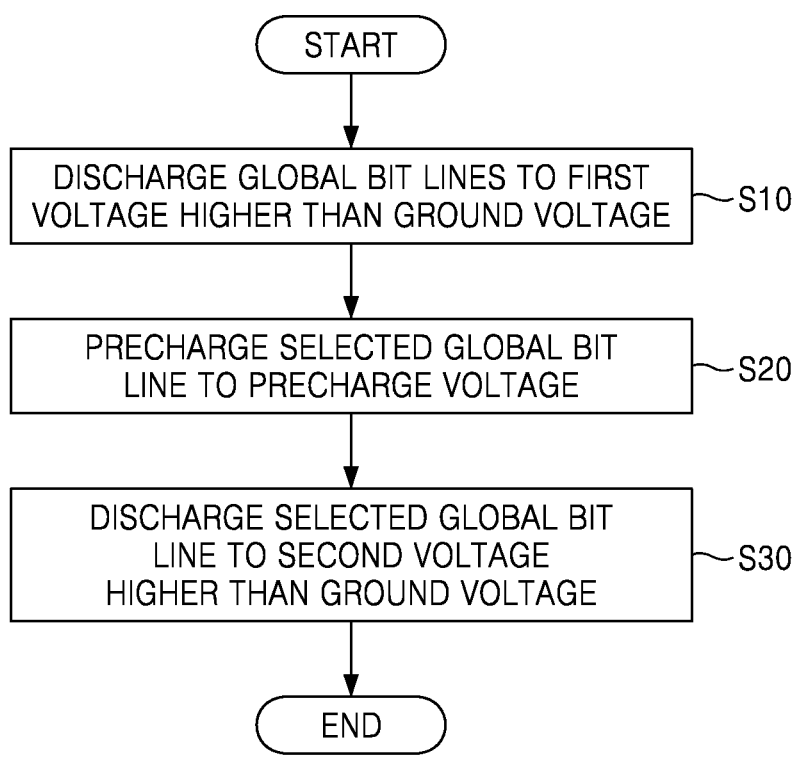
FIG. 11 is a flowchart of a voltage control method for the memory device illustrated in FIG. 1.

FIG. 10 is a timing chart of control signals for controlling the operation of the memory device 10 illustrated in FIG. 1. FIG. 11 is a flowchart of a voltage control method for the memory device 10 illustrated in FIG. 1.

Referring to FIGS. 2, 7, and 9 through 11, the switches 41-1 through 41-$m$ included in the switching circuit 41 of the discharge circuit block 40 connect the global bit lines GBL11 through GBL1$m$, respectively, to the discharge line 43 in response to the first discharge enable signal DIS_EN output from the timing generator 80. When only one of the first and second switching signals SW1 and SW2 is at high level, the first discharge circuit 45-1 discharges the global bit lines GBL11 through GBL1$m$ to the first voltage, e.g., Vtn, which is higher than the ground voltage in operation S10. When both of the first and second switching signals SW1 and SW2 are at a low level, the first discharge circuit 45-1 discharges the global bit lines GBL11 through GBL1$m$ to the first voltage, e.g., 2Vtn, which is higher than the ground voltage in operation S10.

When the first global bit line selection signal GY1 changes from a low level to a high level, the first global bit line GBL11 that has been precharged to the first voltage is connected with the data line SDL. Thereafter, the precharge circuit 71 precharges the data line SDL in response to the precharge enable signal PRE_EN being at a high level in operation S20.

The second discharge circuit 73 discharges the data line SDL to the second voltage in response to the second discharge enable signal SDLDIS changing to a high level in operation S30. At this time, the slope control circuit TRs may control the discharge slope of the voltage VSDL of the data line SDL according to the level of the slope control signal VDIS. For instance, when the level of the slope control signal VDIS increases, the discharge slope of the voltage VSDL of the data line SDL may be increased. As illustrated in FIG. 10, when the slope control signal VDIS has levels VDIS1, VDIS2, and VDIS3, the voltage VSDL of the data line SDL has slopes SLP1, SLP2, and SLP3, respectively.

Figure 12:
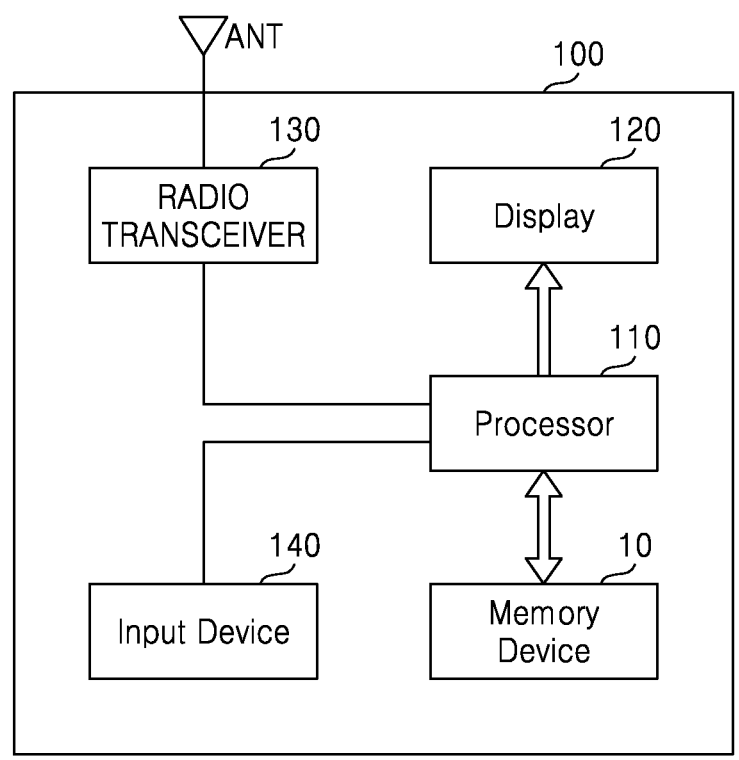
FIG. 12 is a diagram of a memory system including the memory device illustrated in FIG. 1, according to an exemplary embodiment.

FIG. 12 is a diagram of a memory system 100 including the memory device 10 illustrated in FIG. 1, according to an exemplary embodiment. The memory system 100 may be a cellular phone, a smart phone, or a wireless Internet system and include the memory device 10 and a processor 110 controlling the data processing operation, e.g., the program operation of the memory device 10. Data, e.g., programmed bits, stored in the memory device 10 may be controlled by the processor 110 to be displayed through a display 120.

A radio transceiver 130 transmits or receives radio signals through an antenna ANT. The radio transceiver 130 may convert radio signals received through the antenna ANT into signals that can be processed by the processor 110. Accordingly, the processor 110 may process the signals output from the radio transceiver 130 and store the processed signals in the memory device 10 or display them through the display 120. The radio transceiver 130 may also convert signals output from the processor 110 into radio signals and outputs the radio signals through the antenna ANT.

An input device 140 enables control signals for controlling the operation of the processor 110 or data to be processed by the processor 110 to be input to the memory system. The input device 140 may be implemented by a pointing device such as a touch pad or a computer mouse, a keypad, or a keyboard.

The processor 110 may control the operation of the display 120 to display data output from the memory device 10, data output from the radio transceiver 130, or data output from the input device 140.

Figure 13:
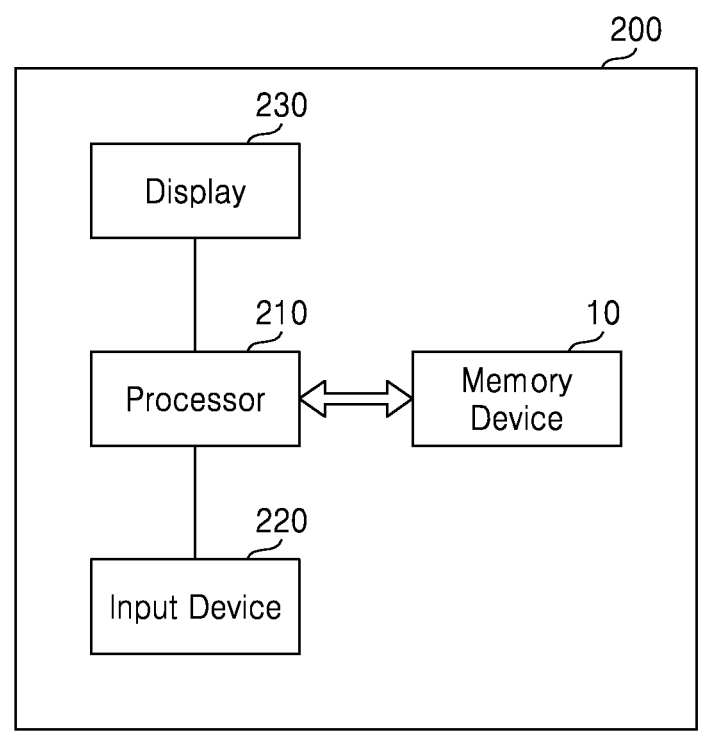
FIG. 13 is a diagram of a memory system including the memory device illustrated in FIG. 1, according to an exemplary embodiment.

FIG. 13 is a diagram of a memory system 200 including the memory device 10 illustrated in FIG. 1, according to an exemplary embodiment. The memory system 200 may be a data processor such as a tablet computer, a netbook, an e-reader, a personal digital assistant (PDA), a portable multimedia player (PMP), an MP3 player, or an MP4 player. The memory system 200 includes the memory device 10 and a processor 210 controlling the data processing operation of the memory device 10.

The processor 210 may cause data stored in the memory device 10 to be displayed through a display 230 in response to an input signal generated by an input device 220. The input device 220 may be implemented by a pointing device such as a touch pad or a computer mouse, a keypad, or a keyboard.

Figure 14:
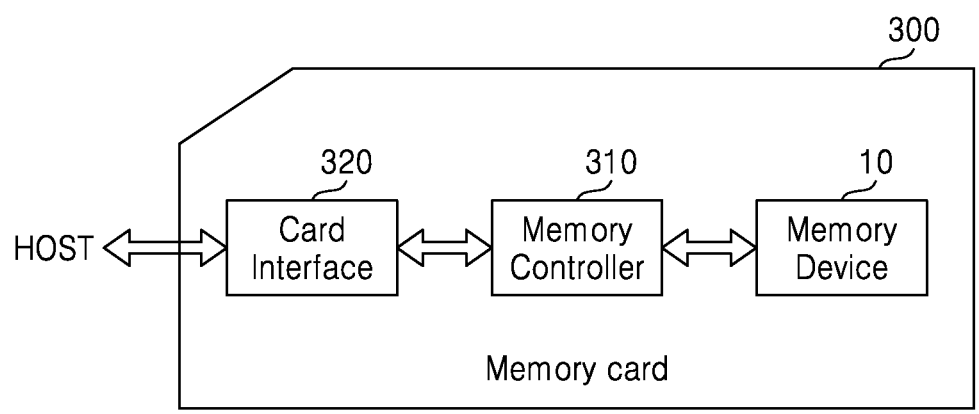
FIG. 14 is a diagram of a memory system including the memory device illustrated in FIG. 1, according to an exemplary embodiment.

FIG. 14 is a diagram of a memory system 300 including the memory device 10 illustrated in FIG. 1, according to an exemplary embodiment. The memory system 300 may be a memory card or a smart card. The memory system 300 includes the memory device 10, a memory controller 310, and a card interface 320.

The memory controller 310 may control data exchange between the memory device 10 and the card interface 320. The card interface 320 may be a secure digital (SD) card interface or a multi-media card (MMC) interface, but the exemplary embodiment is not restricted thereto. The card interface 320 may interface a host and the memory controller 310 for data exchange according to a protocol of the host. When the memory system 300 is connected with a host such as a computer, a digital camera, a digital audio player, a cellular phone, a console video game hardware, or a digital set-top box, the host may transmit data to or receive data from the memory device 10 through the card interface 320 and the memory controller 310.

Figure 15:
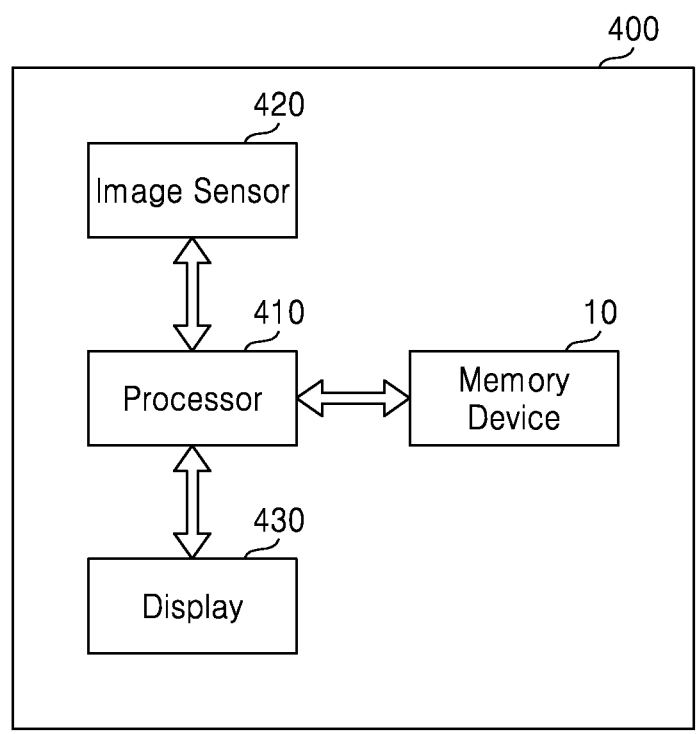
FIG. 15 is a diagram of a memory system including the memory device illustrated in FIG. 1, according to an exemplary embodiment.

FIG. 15 is a diagram of a memory system 400 including the memory device 10 illustrated in FIG. 1, according to an exemplary embodiment. The memory system 400 may be a digital camera or a cellular phone equipped with a digital camera. The memory system 400 includes the memory device 10 and a processor 410 controlling the data processing operation of the memory device 10.

An image sensor 420 included in the memory system 400 converts optical images into digital signals. The digital signals are controlled by the processor 410 to be stored in the memory device 10 or displayed through a display 430. The digital signals stored in the memory device 10 may also be controlled by the processor 410 to be displayed through the display 430.

Figure 16:
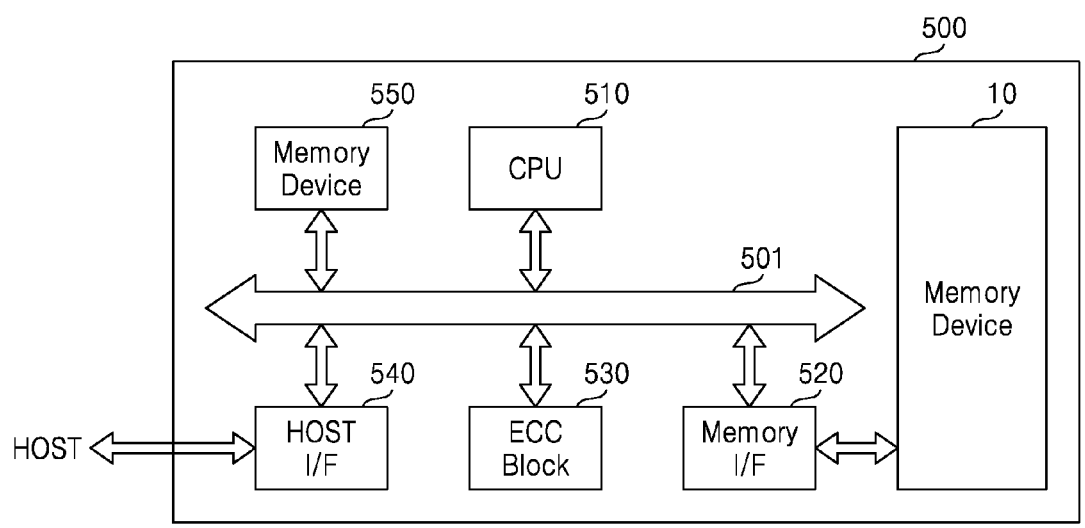
FIG. 16 is a diagram of a memory system including the memory device illustrated in FIG. 1, according to an exemplary embodiment.

FIG. 16 is a diagram of a memory system 500 including the memory device 10 illustrated in FIG. 1, according to an exemplary embodiment. The memory system 500 includes the memory device 10 and a central processing unit (CPU) 510 that controls the operation of the memory device 10. The memory system 500 also includes another memory device 550 an operation memory of the CPU 510. The memory device 550 may be implemented by a non-volatile memory like read-only memory (ROM).

A host connected with the memory system 500 may transmit data to, or receive data from, the memory device 10 through a memory interface 520 and a host interface 540. An error correction code (ECC) block 530 is controlled by the CPU 510 to detect and correct errors in data read from the memory device 10 through the memory interface 520.

The CPU 510 controls data exchange among the memory interface 520, the ECC block 530, the host interface 540, and the memory device 550 through a bus 501. The memory system 500 may be a universal serial bus (USB) memory drive or memory stick.

Figure 17:
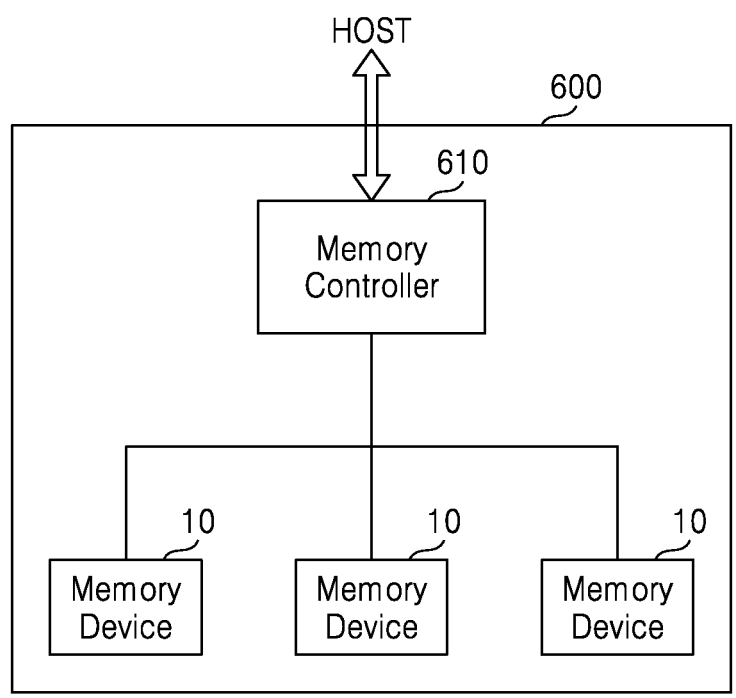
FIG. 17 is a diagram of a memory system including the memory device illustrated in FIG. 1, according to an exemplary embodiment.

FIG. 17 is a diagram of a memory system 600 including the memory device 10 illustrated in FIG. 1, according to an exemplary embodiment. The memory system 600 may be a data storage system like a solid state drive (SSD). The memory system 600 includes a plurality of memory devices 10 and a memory controller 610 that controls the data processing operation of the memory devices 10. The memory system 600 may be implemented by a memory module.

Figure 18:
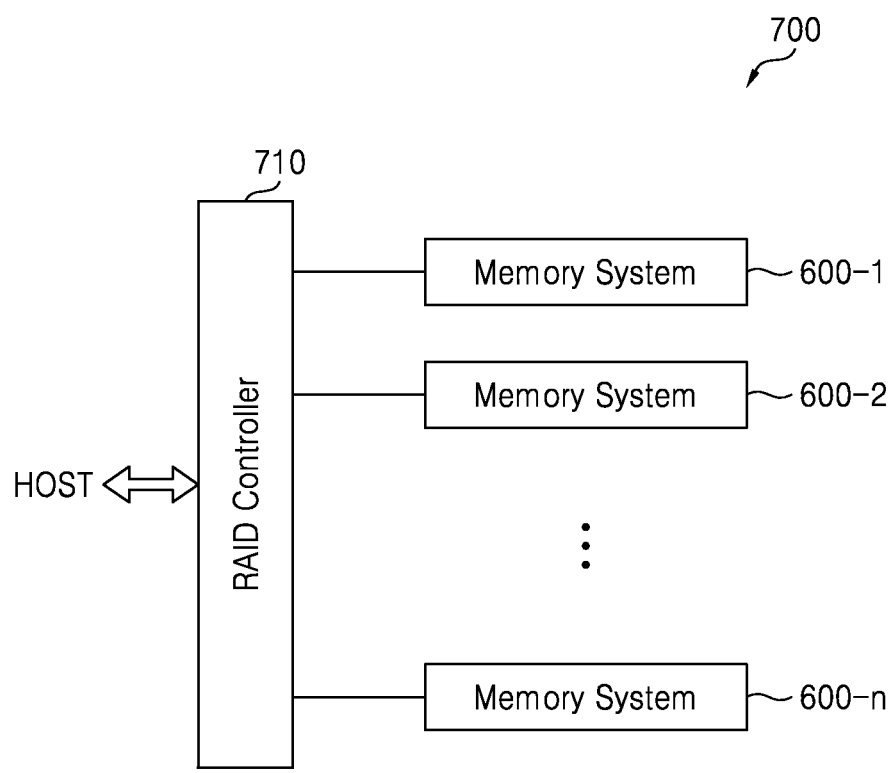
FIG. 18 is a diagram of a data processing unit including the memory system illustrated in FIG. 17.

FIG. 18 is a diagram of a data processing unit 700 including the memory system 600 illustrated in FIG. 17. The data processing unit 700 may be implemented by a redundant array of independent disks (RAID). The data processing unit 700 includes a RAID controller 710 and a plurality of modules 600-1 through 600-n where "n" is a natural number. Each of the modules 600-1 through 600-n may be the memory system 600 illustrated in FIG. 17. The modules 600-1 through 600-n may form a RAID array.

The data processing unit 700 may be implemented as a personal computer or an SSD. During a program operation, the RAID controller 710 may transmit program data received from a host to one of the modules 600-1 through 600-n according to one RAID level selected from among a plurality of RAID levels based on RAID level information in response to a program command received from the host. During a read operation, the RAID controller 710 may transmit to the host data read from one of the modules 600-1 through 600-n according to one RAID level selected from among a plurality of RAID levels based on RAID level information in response to a read command received from the host.

The characters "m", "n", "k", "j", and "nm" shown in the above description are used to indicate that there are a plurality of corresponding elements and using the same character for different elements does not mean that the numbers of the different elements are the same.

According to some exemplary embodiments, coupling noise between a write global bit line and an adjacent read global bit line is minimized regardless of the radical change in voltage of the write global bit line. In addition, discharge time for the write global bit line is reduced, so that fast writing is achieved.

While the present disclosure references multiple exemplary embodiments, it will be understood by those of ordinary skill in the art that various changes in forms and details may be made therein without departing from the spirit and scope of the present disclosure as defined by the following claims.

What is claimed is:

1. A method of controlling a voltage of a memory device, the method comprising:
   connecting at least two global bit lines with a discharge line through a switching circuit according to a discharge enable signal; and
   applying a first voltage that is higher than a ground voltage to the discharge line to discharge the at least two global bit lines to the first voltage.

2. The method of claim 1, wherein the first voltage is a threshold voltage of at least one diode-connected transistor connected to the discharge line.

3. The method of claim 1, further comprising applying a precharge voltage to a first global bit line of the at least two global bit lines.

4. The method of claim 3, further comprising discharging the first global bit line to a second voltage that is higher than the ground voltage.

5. The method of claim 4, wherein the discharging the first global bit line comprises controlling a discharge slope of the second voltage according to a slope control signal.

6. The method of claim 4, wherein the second voltage is a threshold voltage of at least one diode-connected transistor connected through a slope control circuit, a data line, and a Y-gating circuit to the first global bit line.

7. The method of claim 4, wherein the first voltage and the second voltage are equal.

8. The method of claim 4, wherein the second voltage equals the sum of a first threshold voltage of a first diode-connected transistor and a second threshold voltage of a second diode-connected transistor that is connected in series with the first diode-connected transistor; and
   wherein the first diode-connected transistor and the second diode-connected transistor are connected through a slope control circuit, a data line, and a Y-gating circuit to the first global bit line.

9. The method of claim 8, wherein the first global bit line is discharged to the second voltage in two stages.

10. A memory device comprising:
    at least two global bit lines;
    a discharge line;
    a switching circuit configured to connect the at least two global bit lines to the discharge line according to a discharge enable signal; and
    a first discharge circuit configured to apply a first voltage that is higher than a ground voltage to the discharge line.

11. The memory device of claim 10, wherein the first discharge circuit comprises at least one diode-connected transistor connected between the discharge line and a ground.

12. The memory device of claim 10, wherein the first discharge circuit comprises:
    at least first and second diode-connected transistors connected in series with each other between the discharge line and a ground; and
    at least first and second switches; wherein the first switch is connected in parallel with the first diode-connected transistor, and the second switch is connected in parallel with the second diode-connected transistor.

13. The memory device of claim 10, wherein the first discharge circuit comprises:
    a plurality of diode-connected transistors connected in series with each other between the discharge line and a ground; and at least one switch connected between the ground and a common node between two transistors among the plurality of diode-connected transistors.

14. The memory device of claim 10, further comprising:
a precharge circuit configured to apply a precharge voltage to a first global bit line among the at least two global bit lines through a data line and a Y-gating circuit; and
a second discharge circuit configured to discharge the first global bit line to a second voltage that is higher than the ground voltage through the data line and the Y-gating circuit.

15. The memory device of claim 14, wherein the first voltage is the same as the second voltage.

16. The memory device of claim 14, wherein the second discharge circuit comprises:
at least first and second diode-connected transistors connected in series with each other between the data line and a ground; and
at least first and second switches, wherein the first switch is connected in parallel with the first diode-connected transistor, and the second switch is connected in parallel with the second diode-connected transistor.

17. The memory device of claim 14, wherein the second discharge circuit comprises:
a slope control circuit configured to control a discharge slope of the second voltage according to a slope control signal; and
at least one diode-connected transistor connected between the slope control circuit and a ground.

18. The memory device of claim 16, wherein the second discharge circuit further comprises a bias circuit connected between the ground and at least one of the first and second diode-connected transistors.

19. A memory system comprising:
a memory device comprising;
at least two global bit lines;
a discharge line;
a switching circuit configured to connect the at least two global bit lines to the discharge line according to a discharge enable signal; and
a first discharge circuit configured to apply a first voltage that is higher than a ground voltage to the discharge line; and
a processor configured to control an operation of the memory device.

20. The memory system of claim 19, wherein the memory device further comprises:
a precharge circuit configured to apply a precharge voltage to a first global bit line among the at least two global bit lines through a data line and a Y-gating circuit; and
a second discharge circuit configured to discharge the first global bit line to a second voltage that is higher than the ground voltage through the data line and the Y-gating circuit.

* * * * *